US011062787B2

(12) United States Patent
Zhang et al.

(10) Patent No.: US 11,062,787 B2
(45) Date of Patent: Jul. 13, 2021

(54) GATE DRIVING UNIT AND GATE DRIVING METHOD

(71) Applicant: Shenzhen China Star Optoelectronics Semiconductor Display Technology Co., Ltd., Guangdong (CN)

(72) Inventors: Shengdong Zhang, Guangdong (CN); Congwei Liao, Guangdong (CN); Baixiang Han, Guangdong (CN); Yan Xue, Guangdong (CN); Liuqi Zhang, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/620,880

(22) PCT Filed: Nov. 14, 2019

(86) PCT No.: PCT/CN2019/118583
§ 371 (c)(1),
(2) Date: Dec. 10, 2019

(87) PCT Pub. No.: WO2021/031411
PCT Pub. Date: Feb. 25, 2021

(65) Prior Publication Data
US 2021/0057034 A1    Feb. 25, 2021

(30) Foreign Application Priority Data

Aug. 22, 2019 (CN) .......................... 201910777613.9

(51) Int. Cl.
*G11C 19/00* (2006.01)
*G11C 19/28* (2006.01)
(Continued)

(52) U.S. Cl.
CPC .............. *G11C 19/28* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS 7,486,269 B2 * 2/2009 Moon .................. G09G 3/3677
345/100
8,019,039 B1 * 9/2011 Tsai ..................... G11C 19/184
377/64
(Continued)

FOREIGN PATENT DOCUMENTS

CN    103258495 A    8/2013
CN    104376826 A    2/2015
(Continued)

*Primary Examiner* — Tuan T Lam
(74) *Attorney, Agent, or Firm* — Mark M. Friedman

(57) ABSTRACT

A gate driving unit and a gate driving method are provided. The gate driving unit includes an input unit, a driving unit, a pull-down unit, and a pull-down control unit. The pull-down unit has an output terminal of a current stage cascaded signal and an output terminal; in the pull-up phase, the output terminal of the current stage cascaded signal and the output terminal output signal, a voltage of the output terminal of the current stage cascaded signal is pulled down to a first reference low electric level, and a voltage of the output terminal is pulled down to a second reference low electric level.

13 Claims, 10 Drawing Sheets

(51) Int. Cl.
*G09G 3/20* (2006.01)
*G09G 3/36* (2006.01)

(52) U.S. Cl.
CPC ... *G11C 19/287* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 10,706,758 B2 * | 7/2020 | Zhou | G11C 19/28 |
| 2010/0177082 A1 | 7/2010 | Joo | |
| 2011/0157124 A1 * | 6/2011 | Jung | G11C 19/28 |
| | | | 345/211 |
| 2012/0188210 A1 * | 7/2012 | Zhang | G09G 3/3677 |
| | | | 345/204 |
| 2015/0002504 A1 * | 1/2015 | Jo | G09G 3/3677 |
| | | | 345/213 |
| 2015/0228353 A1 | 8/2015 | Qing et al. | |
| 2015/0279480 A1 * | 10/2015 | Murakami | G11C 19/28 |
| | | | 345/100 |
| 2015/0279481 A1 * | 10/2015 | Sasaki | G11C 19/28 |
| | | | 377/69 |
| 2016/0358571 A1 | 12/2016 | Yu | |
| 2017/0069282 A1 * | 3/2017 | Park | G11C 19/287 |
| 2018/0240429 A1 * | 8/2018 | Ogawa | G11C 19/184 |
| 2018/0330685 A1 * | 11/2018 | Zheng | G09G 3/3674 |

FOREIGN PATENT DOCUMENTS

| | | |
|---|---|---|
| CN | 106205528 A | 12/2016 |
| KR | 20100083370 A | 7/2010 |
| KR | 20180036425 A | 4/2018 |

\* cited by examiner

GATE DRIVING UNIT AND GATE DRIVING METHOD

FIELD OF INVENTION

The present disclosure relates to the field of display technologies, and more particularly, to a gate driving unit and a gate driving method.

BACKGROUND OF INVENTION

With the advancement of display technology, display quality of display devices has been improved. In order to provide users a better visual experience, frames of display devices are gradually narrowing and developing towards frameless.

The technology of integrating thin film transistors (TFT) by gate on array (GOA), that is, integrating a GOA unit into an array substrate that includes TFTs arranged in an array, which replaces a conventional arrangement that gate drive units and source drive units are disposed on a longitudinal side and a lateral side of the display panel, can reduce a number of wafers disposed outside the display area. At the same time, the integrated arrangement of a driver module can simplify a packaging process and reduce a space required by the driver module to facilitate a narrower frame.

FIG. 1 shows a circuit diagram of a conventional gate driving unit. A gate driving unit 10 has an input module 12, a driving module 14, a pull-down module 16, and a pull-down control circuit 18. There is a node Q between the input module 12, the driving module 14, the pull-down module 16, and the pull-down control circuit 18. The working phases of the gate driving unit 10 are roughly divided into a pre-charging phase, a pull-up phase, a pull-down phase, and an electric level maintaining phase. In the pre-charging phase, supplying an input voltage Vin to the gate driving unit 10 by a first transistor T11 of the input module, a gate of the first transistor T11 and a source of the first transistor T11 are connected to each other, transmitting the voltage Vin by the first transistor T11 to the node Q when the input voltage Vin is at a high electric level, and pre-charging the node Q by a storage capacitor Cs; at this time, transmitting a clock signal CLK by the second transistor T12 from a source to a drain after receiving the high electric level, and transmitting the clock signal CLK to an output terminal OUT1 of the gate driving unit 10. Then, the gate driving unit 10 enters the pull-up phase, transmitting the high electric level to the output terminal OUT1 of the gate driving unit 10 by the clock signal CLK, continuing to pull a electric level of the node Q up to speed up a speed of driving, and transmitting a low electric level to a gate of a fifth transistor T15 and a gate of a sixth transistor T16 to make it not turn on by the pull-down control circuit 18. Then, in the pull-down phase, pulling the voltage of the node Q and the output terminal OUT1 down to a low reference electric level VGL by the high level transmitted by an output signal VR1 and an output signal VR2 transmitted by a gate driving unit of a subsequent stage. In the electric level maintaining phase, transmitting the high level by the pull-down control circuit 18 to the gate of the fifth transistor T15 and the gate of the sixth transistor T16 to make it turn on, maintaining the electric level of the node Q and the electric level of the output terminal OUT1 at the low reference electric level VGL, until the gate driving unit 10 receives the input voltage Vin which is at the high electric level again (i.e., the next light emission).

However, by far the most commonly used transistors are metal oxide thin film transistors (mental oxide TFTs), which use metal oxide semiconductors to form a channel, represented by indium gallium zinc oxide (IGZO) TFTs. IGZO-TFTs have great electrical stress stability and high oxide mobility, so they are often used in high resolution TFT liquid crystal displays and active matrix organic light emitting diodes (AMOLEDs). However, manufacturing technology of forming a channel of TFTs by using metal oxide is immature, often leading to a negative threshold voltage of the TFTs and turning the TFTs into depletion-type TFTs that continuously consume energy. When receiving a negative pressure under illumination, the threshold voltage drift to negative, so electrical leakage and increased power consumption caused by the negative threshold voltage during circuit design needs to be considered. At the same time, due to the negative threshold voltage of the TFT, the high electric level outputted by the output terminal (ie, QB node) of the pull-down control circuit 18 shown in FIG. 1 cannot reach an expected high electric level, causing an overly slow speed of pull-down in the pull-down phase, as well as a problem of unstable electric level in the electric level maintaining phase, affecting the function of the gate driving unit 10.

FIG. 2 shows a circuit diagram of a conventional gate driving circuit which has a negative threshold transistor. The gate driving circuit 20 includes N+2 gate driving units 22. FIG. 3 shows a circuit diagram of the gate driving unit 22 of FIG. 2. In the current gate driving unit for solving the electrical leakage problem of negative threshold voltage, each transistor is additionally added with a corresponding number of transistors to prevent electrical leakage caused by the negative threshold voltage of non-operating transistor. However, this implementation leads to a substantial increase in the number of transistors required, resulting in increased manufacturing cost while being disadvantageous to the making of lightweight and thin display panels.

Therefore, the present disclosure provides a gate driving unit and a gate driving method to prevent electrical leakage caused by a characteristic of negative threshold transistor affecting a correctness of an output signal.

SUMMARY OF INVENTION

The present disclosure provides a gate driving unit including an input unit including a first transistor, wherein a source of the first transistor is receiving an input signal, and a gate of the first transistor is receiving a first clock signal;

a driving unit including a second transistor and a third transistor, wherein a source of the second transistor and a source of the third transistor are receiving a second clock signal, a gate of the second transistor and a gate of the third transistor are connected to a drain of the first transistor, a drain of the second transistor is connected to an output terminal of a cascaded signal of a current stage, and a drain of the second transistor is connected to an output terminal;

a pull-down unit including a fourth transistor, a fifth transistor, a sixth transistor, and a seventh transistor, wherein a gate of the fourth transistor is connect to a third clock signal, a source of the fourth transistor is connected to the drain of the first transistor, a source of the fifth transistor is connected to a drain of the fourth transistor, a source of the sixth transistor and a source of the seventh transistor are connected to the output terminal, a drain of the fifth transistor is connected to a first reference low electric level, a drain of the sixth transistor and a drain of the seventh transistor are connected to a second reference low electric level, and a gate of the seventh transistor is connected to a cascaded reset signal; and a pull-down control unit including an eighth transistor and a ninth transistor, wherein a gate of the eighth transistor is connected to a source of the eighth transistor, a gate of the ninth transistor is connected to the drain of the first transistor, a drain of the eighth transistor is connected to a drain of the ninth transistor and the gate of the ninth transistor, and the gate of the fourth transistor is connected to the pull-down control unit.

Preferably, the source of the eighth transistor and the source of the ninth transistor are receiving a fourth clock signal, and the first clock signal, the second clock signal, and the fourth clock signal output a high electric level sequentially.

Preferably, the gate driving unit further includes a reset unit, the reset unit includes a reset transistor, a source of the reset transistor is connected to the drain of the first transistor, a gate of the reset transistor is receiving an external control signal, a drain of the reset transistor is connected to the second reference low electric level, and the reset transistor pulls down the drain of the first transistor to the second reference low electric level when the control signal is at a high electric level.

The present disclosure further provides a gate driving unit including an input unit including a first transistor, wherein a source of the first transistor is receiving an input signal, and a gate of the first transistor is receiving a first clock signal;

a driving unit including a second transistor and a third transistor, wherein a source of the second transistor and a source of the third transistor are receiving a second clock signal, a gate of the second transistor and a gate of the third transistor are connected to the drain of the first transistor, a drain of the second transistor is connected to an output terminal of a cascaded signal of a current stage, and a drain of the second transistor is connected to an output terminal;

a pull-down unit including a fourth transistor, a fifth transistor, a sixth transistor, and a seventh transistor, wherein a source of the fourth transistor is connected to a drain of the first transistor, a source of the fifth transistor is connected to a drain of the fourth transistor, a source of the sixth transistor and a source of the seventh transistor are connected to the output terminal, and a drain of the fifth transistor is connected to a first reference low electric level, a drain of the sixth transistor and a drain of the seventh transistor is connected to a second reference low electric level, a gate of the seventh transistor is connected to a cascaded reset signal; and a pull-down control unit including an eighth transistor and a ninth transistor, wherein a gate of the eighth transistor is connected to a source of the eighth transistor, a gate of the ninth transistor is connected to the drain of the first transistor, a drain of the eighth transistor is connected to a drain of the ninth transistor and the gate of the ninth transistor.

Preferably, a gate of the fourth transistor is connected to a third clock signal.

Preferably, a gate of the fourth transistor is connected to the pull-down control unit.

Preferably, the source of the eighth transistor and the source of the ninth transistor are receiving a fourth clock signal, and the first clock signal, the second clock signal, and the fourth clock signal output a high electric level sequentially.

Preferably, the gate driving unit further includes a reset unit, the reset unit includes a reset transistor, a source of the reset transistor is connected to the drain of the first transistor, a gate of the reset transistor is receiving an external control signal, a drain of the reset transistor is connected to the second reference low electric level, and the reset transistor pulls down the drain of the first transistor to the second reference low electric level when the control signal is at a high electric level.

The present disclosure further provides a gate driving method including a pre-charge phase, a driving phase, a pull-down phase, and a electric level maintaining phase, wherein the gate driving method further includes:

in the pre-charge phase, transmitting an input signal received by a source of a first transistor to a drain of the first transistor when the first clock signal is at a high electric level;

in the driving phase, when a second clock signal is at the high electric level, receiving the input signal transmitted by the drain of the first transistor by a gate of the second transistor and a gate of the third transistor, a source of the second transistor transmitting the second clock signal to an output terminal of a cascaded signal of a current stage by a source of the second transistor, transmitting the second clock signal to the output terminal by a source of the third transistor, and transmitting the input signal from the drain of the first transistor to an output terminal of the cascaded signal of the current stage by the fourth transistor when the fourth transistor is turned on;

in the pull-down phase, pulling the voltage of the output terminal down to a second reference low electric level by a seventh transistor when a gate of the seventh transistor receiving a high electric level signal, wherein a fifth transistor and a sixth transistor are turned off, a source of the fifth transistor is connected to the output terminal of the cascaded signal of the current stage, a source of the sixth transistor is connected to the output terminal, a drain of the fifth transistor is connected to a first reference low electric level, a drain of the sixth transistor is connected to the second reference low electric level, a source of the seventh transistor is connected to the output terminal, and a drain of the seventh transistor is connected to the second reference low electric level;

in the electric level maintaining phase, when a gate of an eighth transistor is receiving the high electric level, receiving the high electric level from a drain of the eighth transistor by a gate of the fifth transistor and a gate of the sixth transistor, and pulling down a electric level of the output terminal of the cascaded signal of the current stage to the first reference low electric level by the fifth transistor, and pulling a electric level of the output terminal down to the second reference low electric level by the sixth transistor, wherein a gate of the eighth transistor is connected to a source of the eighth transistor.

Preferably, a gate of the fourth transistor is connected to a third clock signal.

Preferably, a gate of the fourth transistor is connected to a drain of the eighth transistor.

Preferably, the source of the eighth transistor receiving a fourth clock signal, and the first clock signal, the second clock signal, and the fourth clock signal output the high electric level sequentially.

Preferably, a gate of the reset transistor is connected to a drain of the first transistor, a drain of the reset transistor is connected to the second reference low electric level, when the gate of the reset transistor receiving high electric level, pulling down a electric level of the first transistor to the second reference low electric level by the reset transistor.

By providing the gate driving circuit and the gate driving method of the present disclosure, ensuring the gate driving unit outputs a correct signal when the transistor of the gate driving circuit is provided with negative threshold.

DETAILED DESCRIPTION OF PREFERRED EMBODIMENTS

The gate driving circuit and the gate driving method provided by the embodiments of the present invention are described in detail below with reference to the accompanying figures. It is obvious that the described embodiments are only part of the embodiments of the present disclosure, and not all of the embodiments. All other embodiments obtained by those skilled in the art based on the embodiments of the present disclosure without inventive steps are within the scope of the present disclosure.

Figure 4:
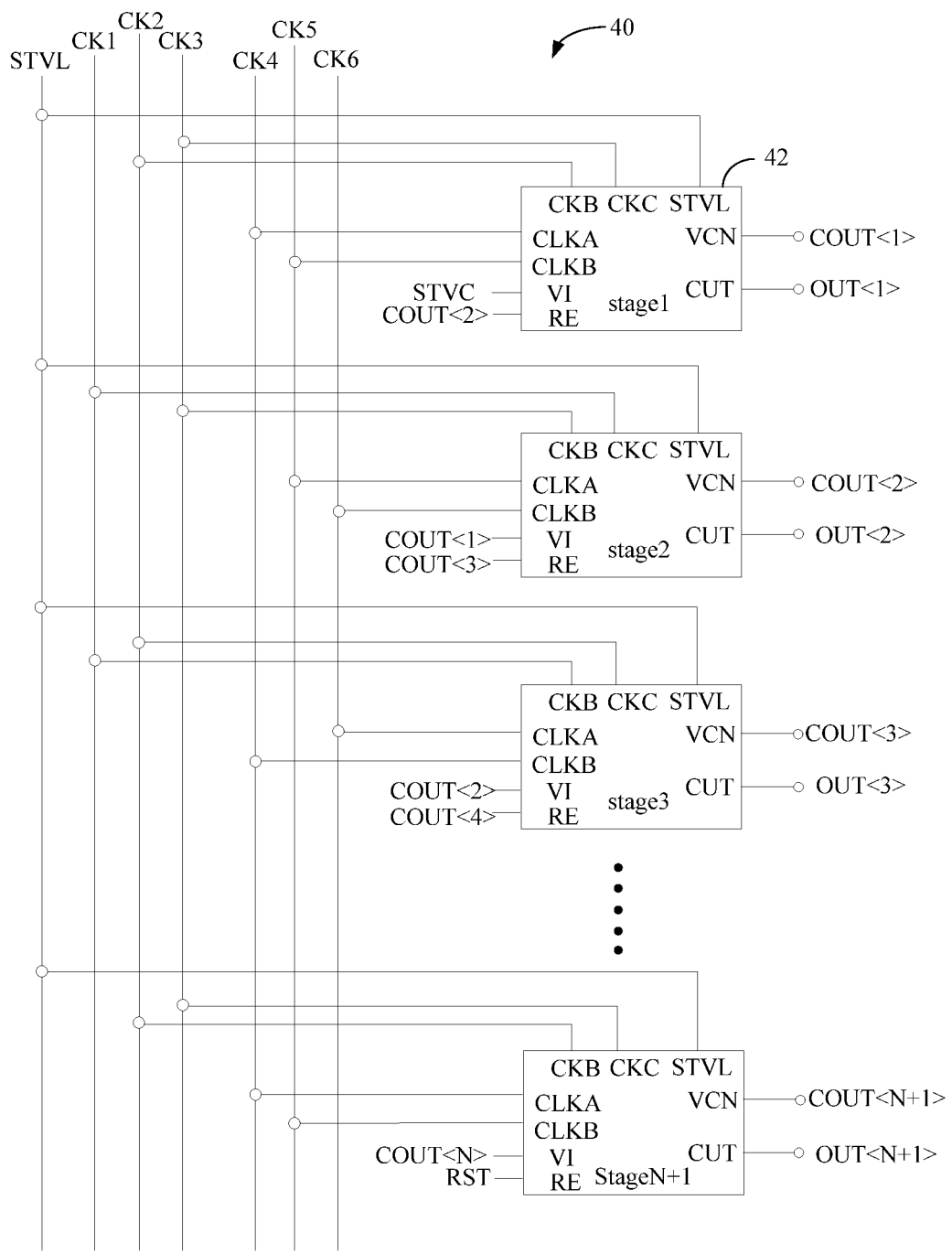
FIG. 4 shows a circuit diagram of a gate driving circuit of the present disclosure.
Figure 5:
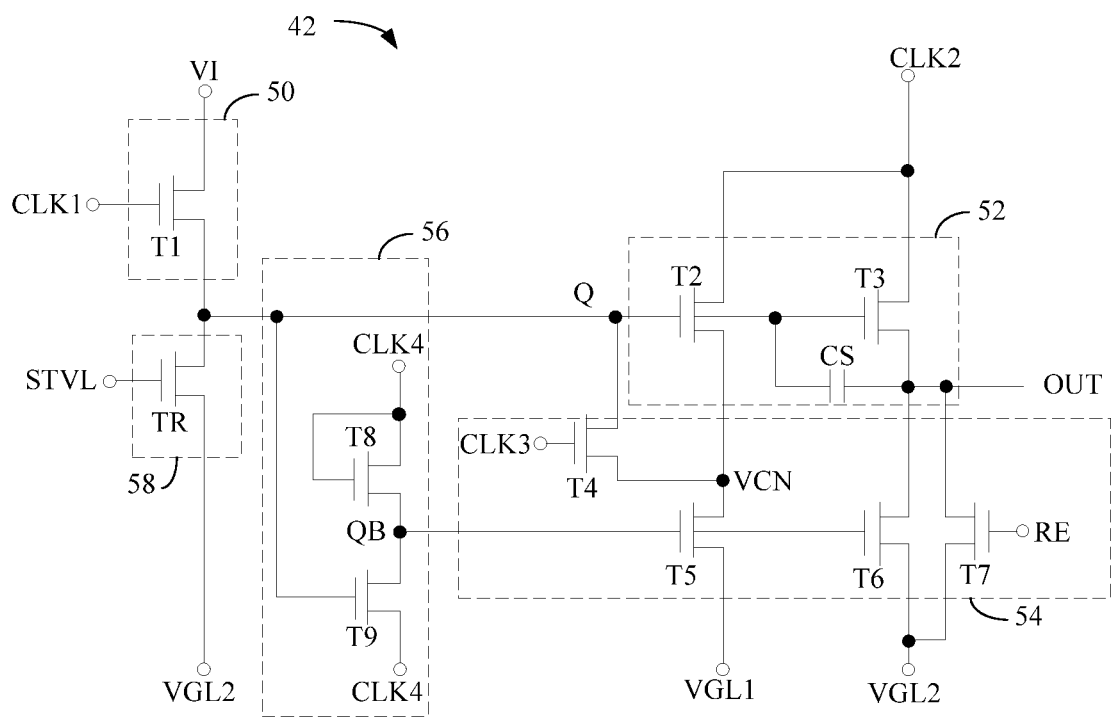
FIG. 5 shows a circuit diagram of a gate driving unit of a first embodiment of the present disclosure.

FIG. 4 shows a circuit diagram of a gate driving circuit of the present disclosure. The gate driving circuit 40 consists of N+1 gate driving units 42. FIG. 5 shows a circuit diagram of a gate driving unit 42 of a first embodiment of the present disclosure. Please referring to FIG. 4 and FIG. 5 together, the gate driving unit 42 has an input unit 50, a driving unit 52, a pull-down unit 54, a pull-down control unit 56, and a reset unit 58.

The input unit 50 includes a first transistor T1, a source of the first transistor T1 receives an input signal VI, a gate of the first transistor T1 receives a first clock signal CLK1, and a drain of the first transistor T1 is connected to a node Q. The node Q is a node of the gate driving unit 42, located between the input unit 50, the driving unit 52, the pull-down unit 54, the pull-down control unit 56, and the reset unit 58.

The driving unit 52 includes a second transistor T2 and a third transistor T3, wherein a source of the second transistor T2 and a source of the third transistor T3 receive a second clock signal CLK2, a gate of the second transistor T2 and a gate of the third transistor T3 are connected to the node Q, a drain of the second transistor T2 is connected to an output terminal of a cascaded signal of a current stage VCN, a drain of the third transistor T3 is connected to the gate of the third transistor T3 by a storage capacitor CS, at the same time, the drain of the third transistor T3 is connected to an output terminal OUT, when the node Q is at a high electric level, the driving unit 52 outputs the high electric level to the output terminal OUT to drive a pixel electrode of a display panel (not shown in figure).

The pull-down unit 54 includes a fourth transistor T4, a fifth transistor T5, a sixth transistor T6, and a seventh transistor T7, a source of the fourth transistor T4 is connected to the node Q, a gate of the fourth transistor T4 receives a third clock signal CLK3, and a drain of the fourth transistor T4 is connected to the output terminal of the cascaded signal of the current stage VCN. A source of the fifth transistor T5 is connected to the cascaded signal of the current stage VCN, a gate of the fifth transistor T5 is connected to the pull-down control unit 56, and a drain of the fifth transistor T5 is connected to a first reference low electric level VGL1. A drain of the sixth transistor T6 and a drain of the seventh transistor T7 are connected to a second reference low electric level VGL2, a gate of the sixth transistor T6 is connected to the pull-down control unit 56, a gate of the seventh transistor receives a cascaded reset signal RE. In an embodiment of the present disclosure, the cascaded reset signal RE is a scan signal for a subsequent stage. The pull-down unit 54 is configured to pull the electric level of the output terminal of the cascaded signal of the current stage VCN and the electric level of the output terminal of the scan signal of the current stage OUT down to the electric level of the low potential terminal, after outputting the scan signal of the current stage.

The pull-down control unit 56 includes an eighth transistor T8 and a ninth transistor T9, for generating a pull-down control signal and transmitting the pull-down control signal to the gate of the fifth transistor T5 and the gate of the sixth transistor T6 of the pull-down unit 54 by an inner node QB. A source of the eighth transistor T8 receives the fourth clock signal CLK4, a gate of the eighth transistor T8 is connected to the source of the eighth transistor T8, and a drain of the eighth transistor T8 is connected to the inner node QB. A source of the ninth transistor T9 is connected to the inner node Oft a gate of the ninth transistor T9 is connected to the node Q, and a drain of the ninth transistor T9 is connected to the fourth clock signal CLK4. When the fourth clock signal CLK4 is at a high electric level, turning the fifth transistor T5 and the sixth transistor T6 of the pull-down unit 54 on, pulling a electric level of the output terminal of the cascaded signal of the current stage VCN down to the first reference low electric level VGL1, and pulling a electric level of the output terminal OUT down to the second reference low electric level VGL2.

The reset unit 58 includes a reset transistor TR, a source of the reset transistor TR is connected to the node Q, a gate of the reset transistor TR receives a reset signal STVL, and a drain of the reset transistor TR is connected to the second reference low electric level VGL2. When the reset signal is at a high electric level, pulling a electric level of the node Q down to the second reference low electric level VGL2, before the gate driving unit of the current stage outputs the scan signal of the next frame, the node Q is continuously discharges electricity to the second reference low electric level VGL2 to prevent the node Q from an output error and the like caused by accumulating charges.

Figure 6:
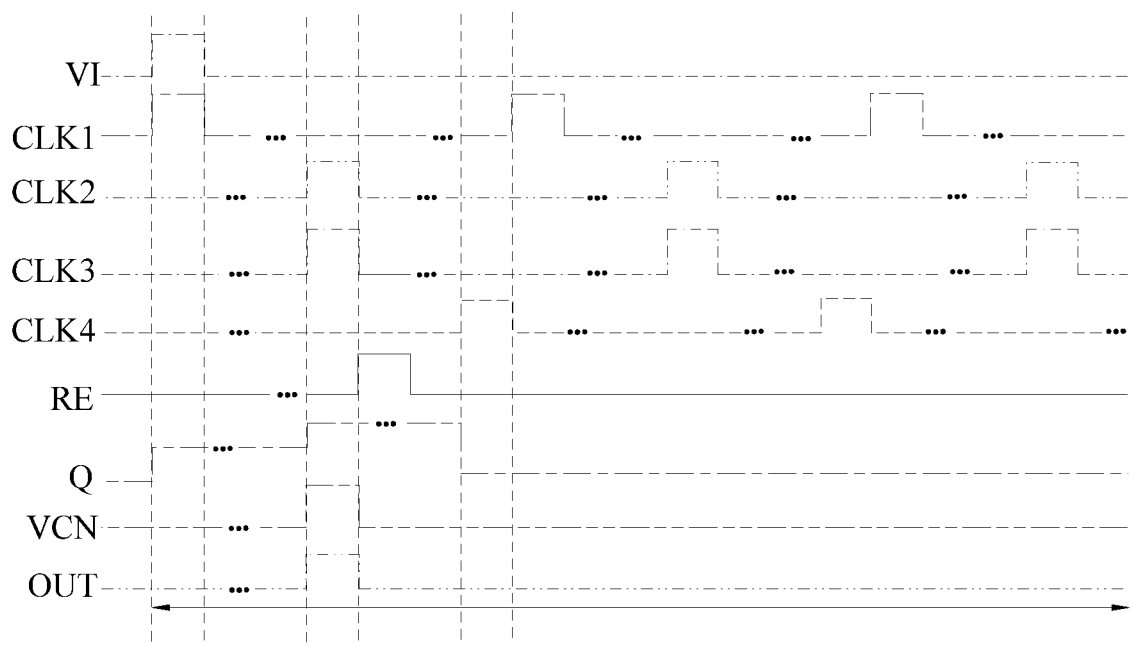
FIG. 6 shows a timing diagram of the gate driving circuit of FIG. 4.

FIG. 6 shows a timing diagram of a gate driving circuit of FIG. 4. In an embodiment of the present disclosure, working phases of the gate driving unit of a gate driving circuit 40 include a pre-charge phase, a pull-up phase, a pull-down phase, and a electric level maintaining phase.

In the pre-charge phase, an input signal VI is at a high electric level, the first clock signal CLK1 is at the high electric level, so the first transistor T1 is turned on to pre-charge the inner node QB. At the same time, transmitting the high electric level of the input signal VI to the node Q by the first transistor T1, turning the second transistor T2 and the third transistor T3 of the driving unit 52 on, and transmitting a low electric level of the second clock signal CLK2 to the cascaded signal of the current stage VCN and the output terminal of the scan signal of the current stage OUT. In the pre-charge phase, turning the ninth transistor T9 of the pull-down control unit 56 on by receiving the high electric level transmitted from the node Q, at the same time, transmitting the fourth clock signal CLK4 which in low electric level to the inner node Oft and turning the fifth transistor T5 and the sixth transistor T6 of the pull-down unit 54 off. Since turning the transistors on and off need time, the seventh transistor T7 and the ninth transistor T9 are turned off in advance in the pre-charge phase to prevent electrical leakage from occurring at a beginning of the pull-up phase, increasing the driving speed of the driving unit 52, and reducing the power consumption caused by the electrical leakage. For depletion-type transistor, simultaneously turning the eighth transistor T8 and the ninth transistor T9 of the pull-down control unit 56 on, pulling the electric level of the inner node QB to the low electric level of the fourth clock signal CLK4, and at this time, a potential of a second stage of the eighth transistor T8 is the same as a potential of a third stage of the ninth transistor T9, thereby preventing power consumption of the electrical leakage and DC path generated in the control circuit.

In the pull-up phase, the first clock signal CLK1 and the input signal VI is at the low electric level, the second clock signal CLK2 is at the high electric level, the second transistor T2 and the third transistor T3 of the driving unit 52 transfer the high electric level of the second clock signal CLK2 to the output terminal of the cascaded signal of the current stage VCN and an output terminal OUT of a scan signal of the current stage. At the same time, the inner node QB is raised to a higher potential to increase the pull-up speed, at the same time, the fourth clock signal CLK4 is still at the low electric level such that the fifth transistor T5 and the sixth transistor T6 of the pull-down unit 54 are continuously turned off.

In the pull-down phase, after outputting the scan signal of the current stage by the output terminal OUT, the first clock signal terminal CLK1 is still at the low electric level, and the second clock signal becomes at the low electric level, in order to speed up the pull-down speed, the node Q remains at the high electric level so that the second transistor T2 and the third transistor T3 of the driving unit 52 remain turned on, discharging electricity to the cascaded signal output terminal VCN and the output terminal of the current stage OUT. In the pull-down phase, the fourth clock signal terminal CLK4 is at the high electric level, therefore, the eighth transistor T8 of the pull-down control unit 56 is turned on to pull the electric level of the inner node QB to the high electric level of the fourth clock signal terminal CLK4, so that the fifth transistor T5 and the sixth transistor T6 of the pull-down unit 54 are discharging to the output terminal of the cascaded signal of the current stage VCN and the output terminal of the current stage OUT, respectively. Therefore, in a pull-down node, the second transistor T2 and the third transistor T3 of the driving unit 52, and the fifth transistor T5 and the sixth transistor T6 of the pull-down unit 54 are simultaneously discharging to the output terminal of the cascaded signal of the current stage VCN and the output terminal of the current stage OUT, thereby increasing the discharging speed. For the depletion-type transistor, in the pull-down phase, the eighth transistor T8 and the ninth transistor T9 of the pull-down control unit 56 are simultaneously turned on to pull the electric level of the inner node QB up to the high electric level of the fourth clock signal terminal CLK4. At the same time, a cascade driving unit of a subsequent stage outputs a scan signal at a high electric level, that is, the cascaded reset signal RE is at the high electric level, and the reset transistor TR discharges electricity by the output terminal OUT. Under simultaneous effect of the sixth transistor T6, the seventh transistor T7, and the third transistor T3, the electric level of the output terminal of the scan signal of the current stage OUT is pulled down to the low electric level rapidly.

In the electric level maintaining phase of low, the fourth clock signal CLK4 is at the high electric level, and the inner node QB is pulled up to the high electric level of the fourth clock signal CLK4 by the eighth transistor T8, so conducting the fifth transistor T5 and the sixth transistor T6 of the pull-down unit 54 continues to pull an output terminal of this stage down. The inner node QB is maintained at the high electric level without a discharge path at this time, so that the fifth transistor T5 and the sixth transistor T6 continue to pull the electric level of the output terminal of the cascaded signal of the current stage VCN and the output terminal OUT down. When the transistor exhibits a negative threshold characteristic, if the fourth clock signal terminal CLK4 is at the low electric level, the inner node QB is discharged electricity to a low electric level due to the electrical leakage, turning the fifth transistor T5 and the sixth transistor T6 off, that is, the circuit stabilizes the output by maintaining the electric level of node Q at the low electric level. The specific working process is as when the first clock signal terminal CLK1 is at the high electric level, turning the first transistor T1 on, pulling the electric level of node Q down to the low electric level of the output signal terminal VI, or when the second clock signal terminal CLK2 and third clock signal terminal CLK3 are at the high electric level, connecting the node Q to the cascaded signal of the current stage VCN by the fourth transistor T4, and utilizing the characteristic that the seventh transistor T7 is the depletion transistor to weakly turn on, so that the electric level of the node Q and the cascaded signal of the current stage VCN is pulled down to the first low electric level VGL1. Since the electric level of the node Q is at the low electric level at this time, turning the second transistor T2 and the third transistor T3 of the driving unit 52 off, therefore, regardless of which working phase, that is, no matter which clock signal is at a high point, the node Q and the inner node QB can maintain the corresponding high electric level or low electric level state to stabilize the output function of the gate driving unit. The output signal of the gate drive unit does not delay or cause an error in the output signal due to the electrical leakage of the depletion-type transistor.

In a first embodiment of the present disclosure, the clock signal connected to the first clock signal terminal CLK1, the second clock signal terminal CLK2, the third clock signal terminal CLK3, and the fourth clock signal terminal CLK4 of the integrated gate driving circuit is a clock signal that does not overlap with M phase (M is an integer greater than or equal to 2), a clock high electric level of the first clock signal CLK1 arrives first, and a clock high electric level of the second clock signal terminal CLK2 and a clock high electric level of the fourth clock signal terminal CLK4 do not arrive at the same time, wherein the clock high electric level of the fourth clock signal terminal CLK4 is delayed by two or more clock pulse widths than the clock high electric level of the second clock signal terminal CLK2, that is, the first clock signal CLK1, the second clock signal CLK2, and the fourth clock signal CLK4 sequentially output the high electric level, and the second clock signal CLK2 and the third clock signal CLK3 may be two clock signals having the same clock timing or connected to the same clock signal source. In order to achieve the optimal effect of speed, power consumption, and reliability, preferably, a clock signal connected to the clock signal terminal selects a three-phase clock signal.

In the first embodiment of the present disclosure, the increase in power consumption and poor function caused by internal electrical leakage caused by the negative threshold characteristic of the transistor can be prevented by the clock signals CLK1 to 4, first reference low electric level VGL1, and the second reference low electric level VGL2. The low electric level of the first clock signal terminal CLK1 and the third clock signal terminal CLK3 is less than the electric level of the second reference low electric level VGL2, and the electric level of the first reference low electric level VGL1 is less than the second reference low electric level VGL2. The electric level of the low electric level of the second clock signal terminal CLK2 and the fourth clock signal terminal CLK4 is equal to the electric level of the first reference low electric level VGL1.

Figure 7:
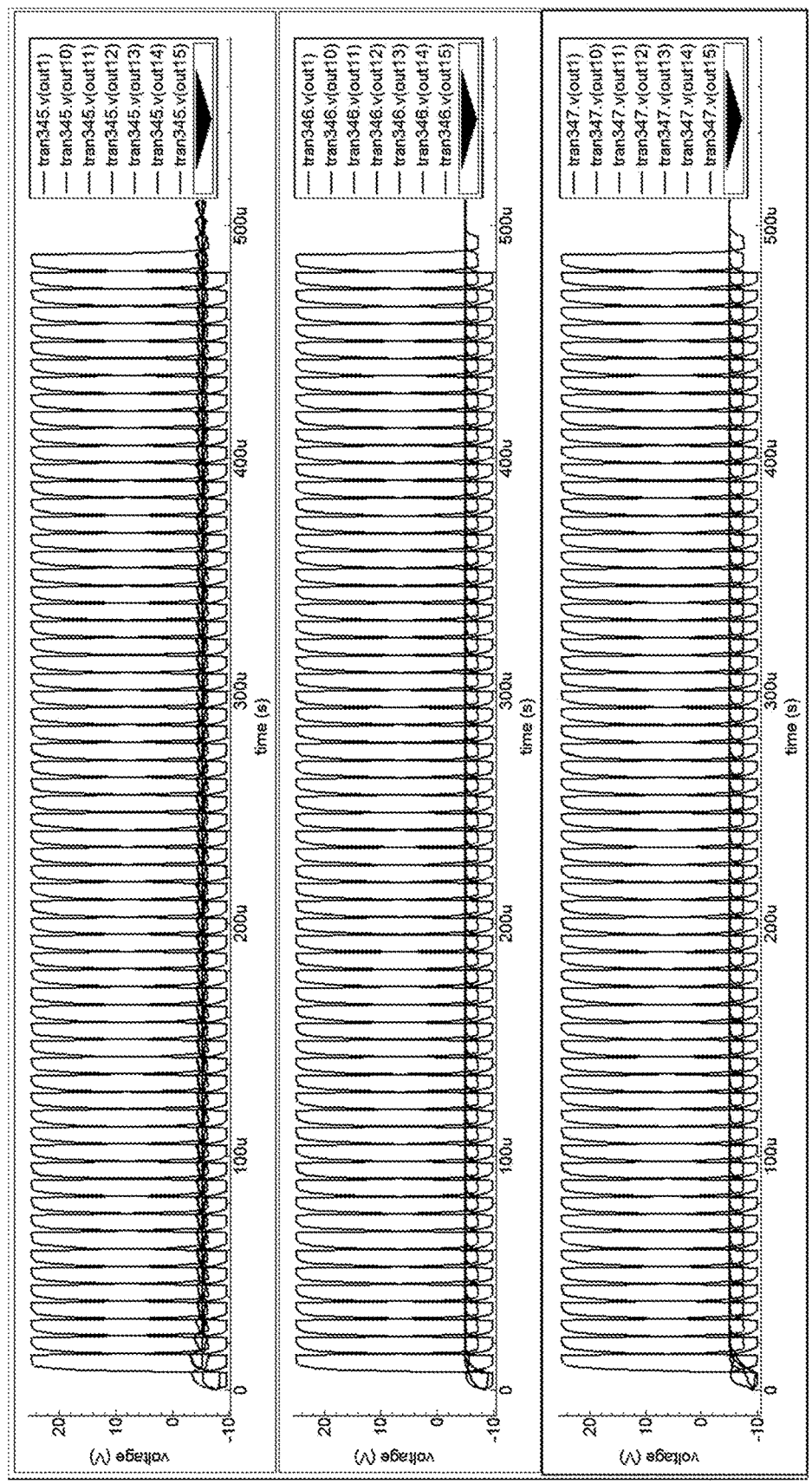
FIG. 7 shows a simulation diagram during a threshold voltage drift towards negative of the gate driving circuit of the first embodiment of the present disclosure.
Figure 8:
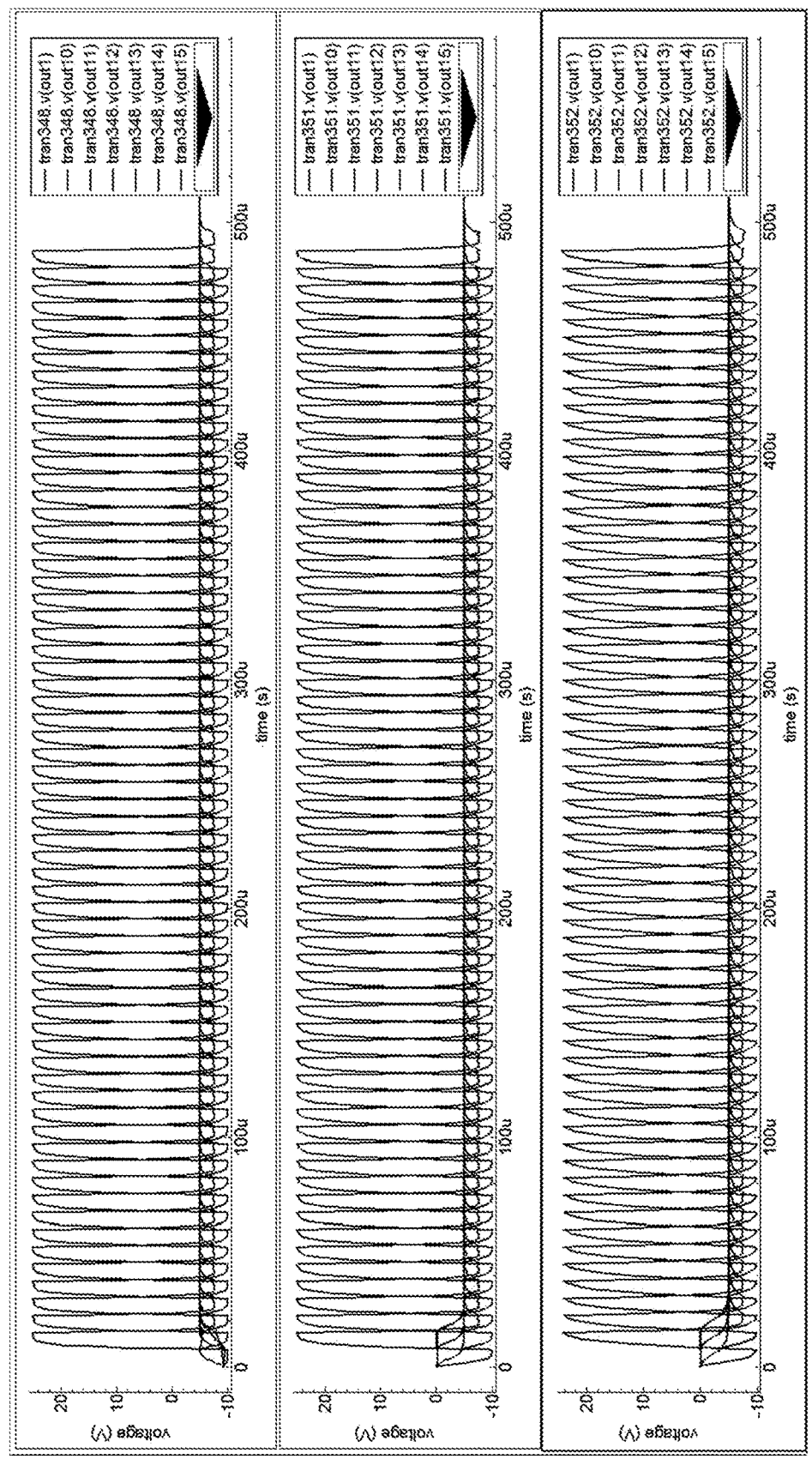
FIG. 8 shows a simulation diagram during the threshold voltage drift towards positive of the gate driving circuit of the first embodiment of the present disclosure.

FIG. 7 shows a simulation diagram during a threshold voltage drift towards negative of the gate driving circuit of the first embodiment of the present disclosure. FIG. 8 shows a simulation diagram during the threshold voltage drift towards positive of the gate driving circuit of the first embodiment of the present disclosure. When the initial threshold voltage is 1 V and the threshold voltage drifts at −10 V, −6 V, and −3 V, and 0 V, 2 V, and 5 V, the cascade can be output normally. It can be seen, since the gate driving circuit structure in the first embodiment of the present invention is simpler than the current gate driving circuit, and the number of transistors and required clock signals is less, the pull-down control unit of the present disclosure can more effectively improve problems of electrical leakage, which may occur with depletion-type transistors, thereby allowing the circuit to operate over a wider range of threshold voltages.

Figure 1:
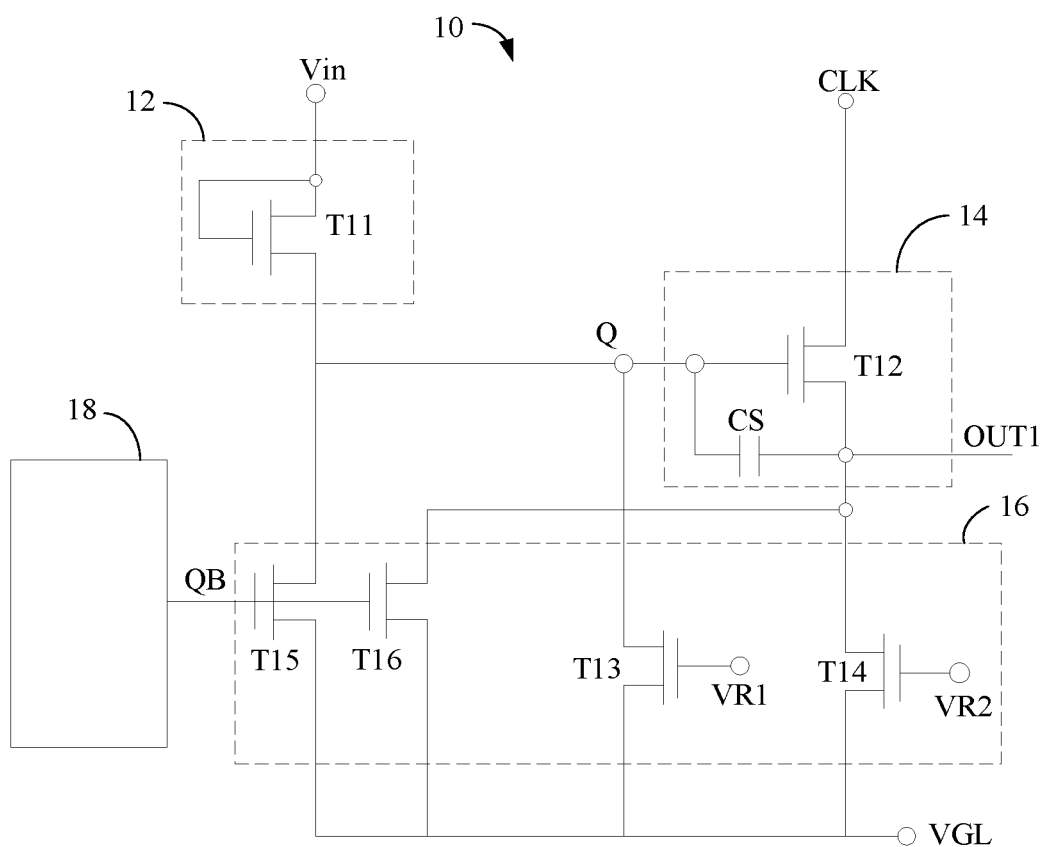
FIG. 1 shows a circuit diagram of a conventional gate driving unit.
Figure 2:
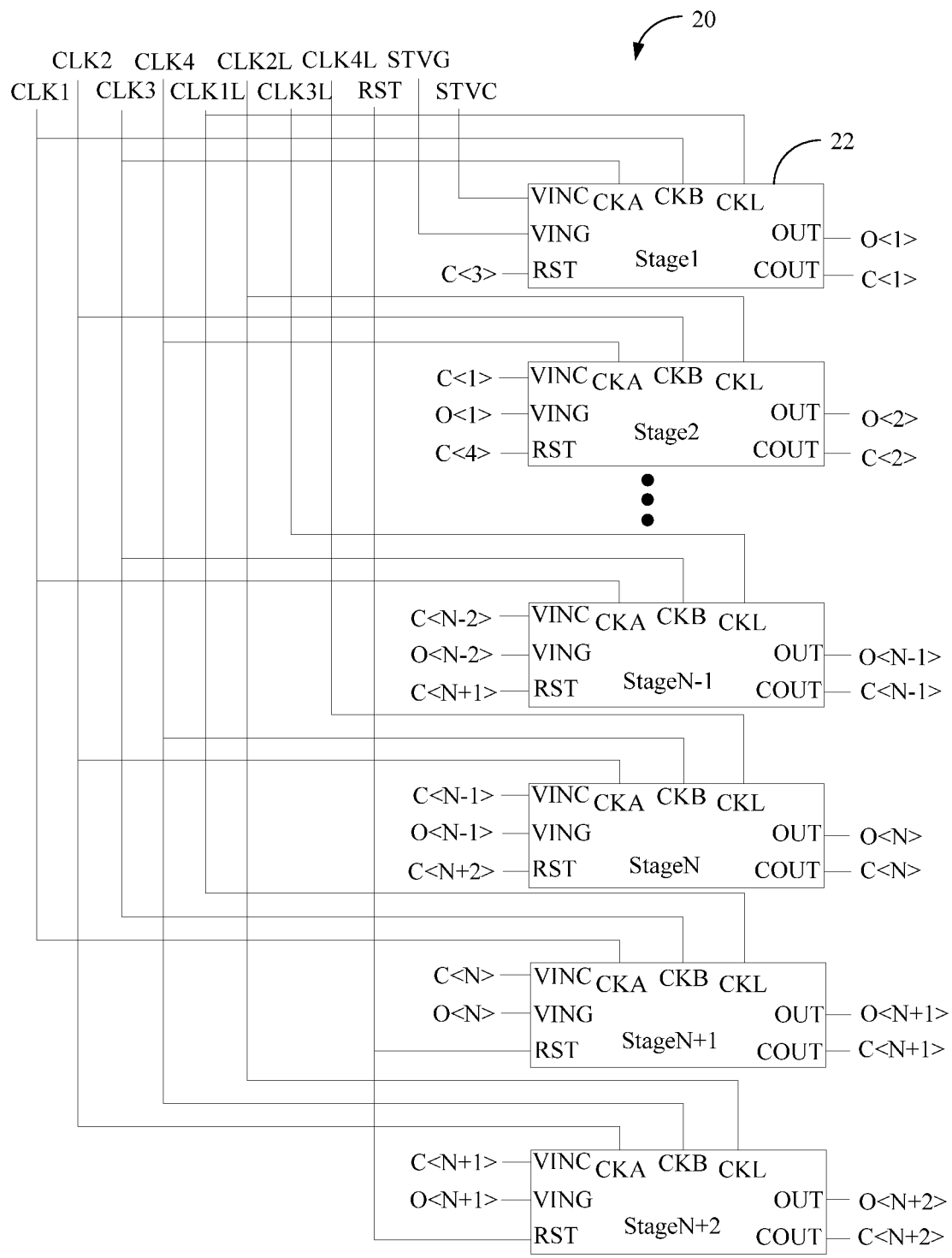
FIG. 2 shows a circuit diagram of a conventional gate driving circuit which has a negative threshold transistor.
Figure 3:
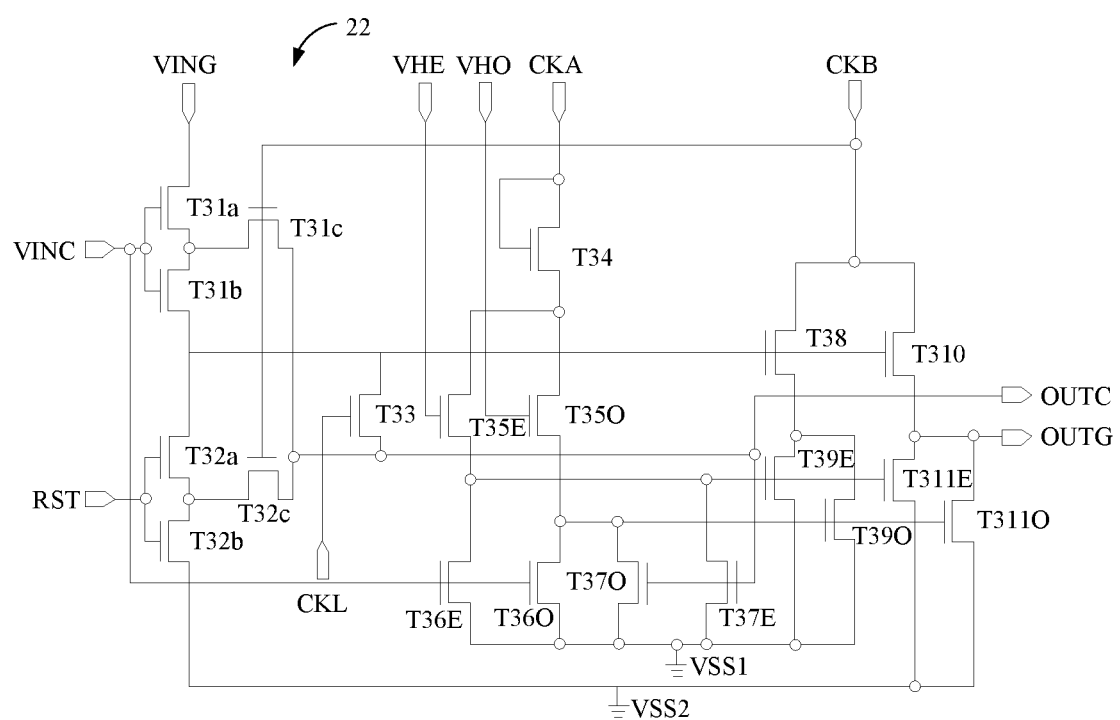
FIG. 3 shows a circuit diagram of the gate driving unit of FIG. 2.
Figure 9:
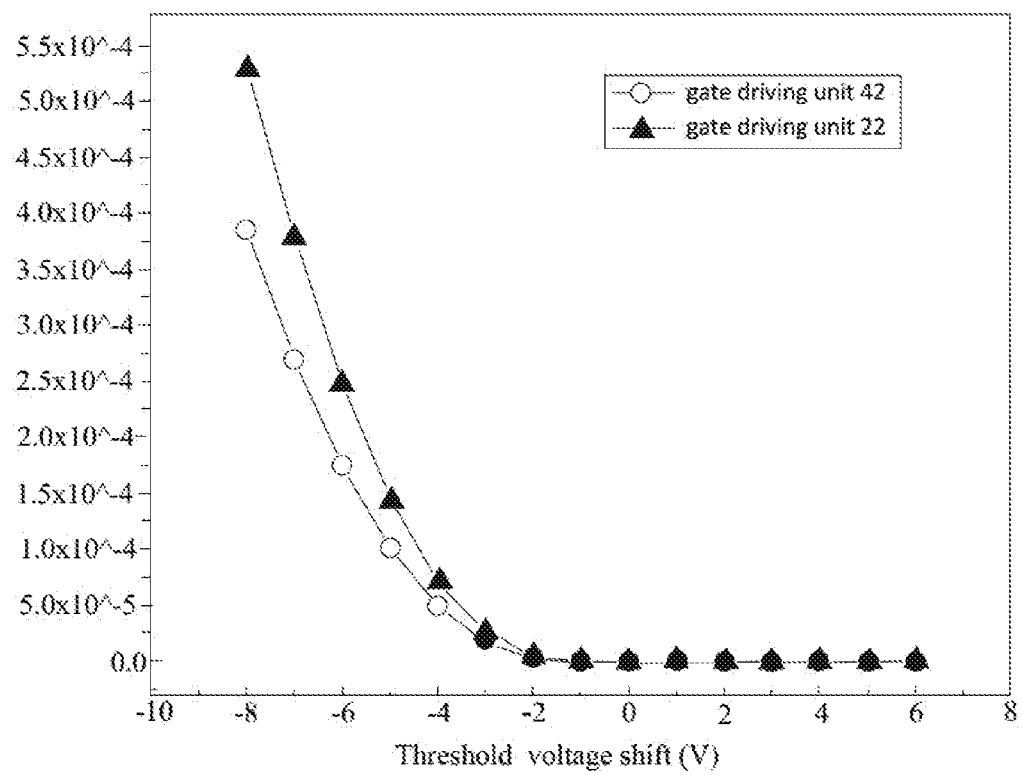
FIG. 9 shows a power consumption comparison diagram of the gate driving unit as shown in the first embodiment and a single-stage gate driving unit of the gate driving unit as shown in FIG. 3 of the present disclosure.

FIG. 9 shows a power consumption comparison diagram of the gate driving unit 42 as shown in the first embodiment and a single-stage gate driving unit of the gate driving unit 22 as shown in FIG. 3 of the present disclosure. During the simulation, both circuits have a load capacitance of 280 pF and a load resistance of 3.4 kΩ, each of which is produces a single pulse signal with a pulse width of 15 μs. It can be seen, the integrated gate drive circuit consumes less power in the first embodiment of the present application in a case where the threshold voltage is the same in one frame time; in the case where the threshold voltage in negative, the power consumption reduction effect is more obvious.

Figure 10:
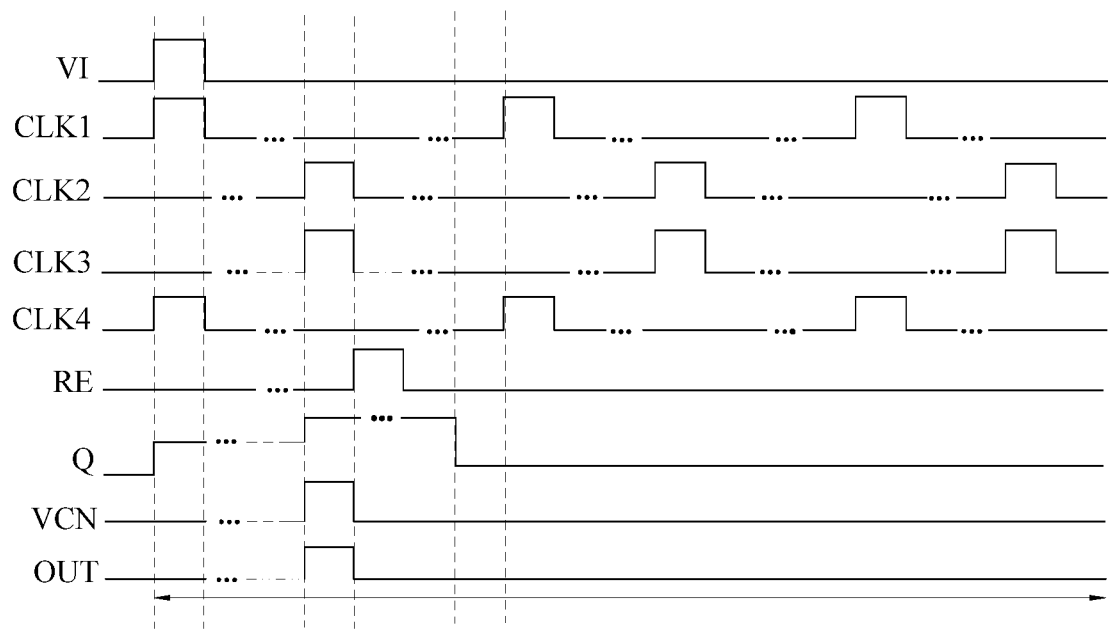
FIG. 10 shows a timing diagram of a gate driving unit according to a second embodiment of the present disclosure.

FIG. 10 shows a timing diagram of a gate driving unit according to a second embodiment of the present disclosure, and the second embodiment also utilizes the gate driving unit 42 as shown in FIG. 5. When the time from turn-on to the turn-off of the transistor is relatively negligible, the first clock signal CLK1 and the fourth clock signal CLK4 may have the same clock. Since the time during which the transistor is turned on and off is negligible, when the fourth clock signal CLK4 turns to the high electric level, the eighth transistor T8 can cause the fifth transistor T5 and the sixth transistor T6 of the pull-down unit 54 to maintain the electric level of the output terminal of the cascaded signal of the current stage VCN and the electric level of the output terminal of the scan signal of the current stage OUT, that is, the fourth clock signal CLK4 does not need to output the high electric level signal before the first clock signal CLK1 reaches the next high electric level pulse, to prevent the time delay of the transistor turning on and off causing the electric level of the output terminal of the cascaded signal of the current stage VCN and the electric level of the output terminal of the scan signal of the current stage OUT from maintaining at the low electric level and not ready to start in the subsequent stage gate driving unit (that is, the next time the first clock signal CLK1 outputs the high electric level pulse), which causes an output signal error.

Figure 11:
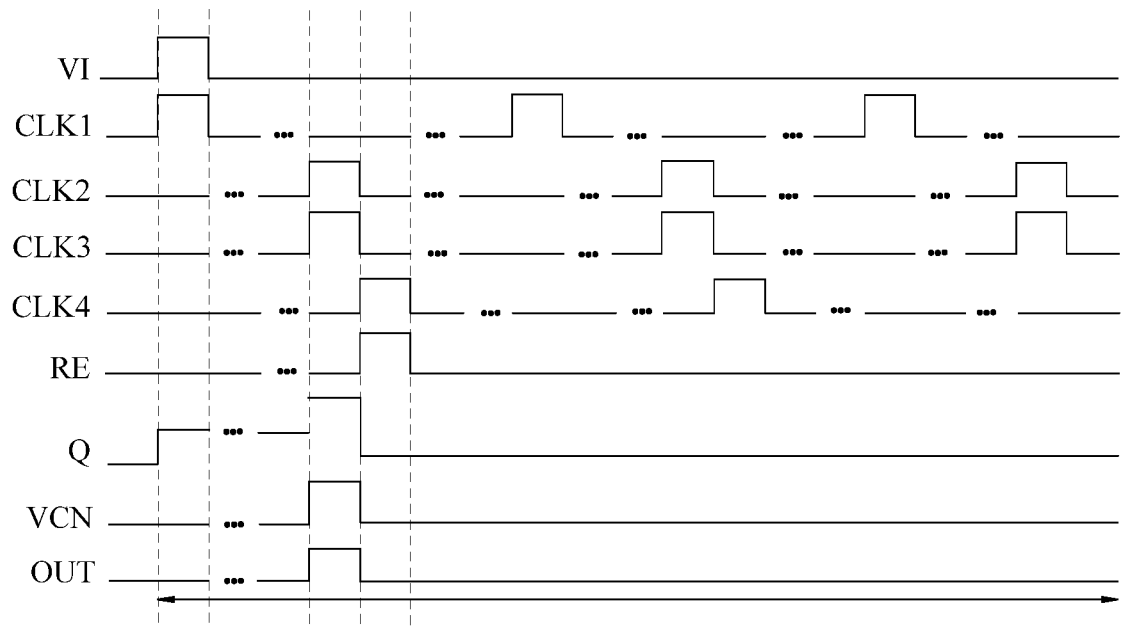
FIG. 11 shows a timing diagram of a gate driving unit according to a third embodiment of the present disclosure.

FIG. 11 shows a timing diagram of a gate driving unit according to a third embodiment of the present disclosure. In the third embodiment, the gate driving unit 42 shown in FIG. 5 is also used. The timing of the gate driving circuit in the third embodiment is applied to the case where the circuit load is small and the pull-down speed is not high, the output terminal of the current stage and the node Q can be simultaneously discharged electricity, the high electric level of fourth clock signal terminal CLK4 only needs to be delayed by one pulse width from the high electric level of the second clock signal CLK2, and the gate driving circuit can operate normally.

Figure 12:
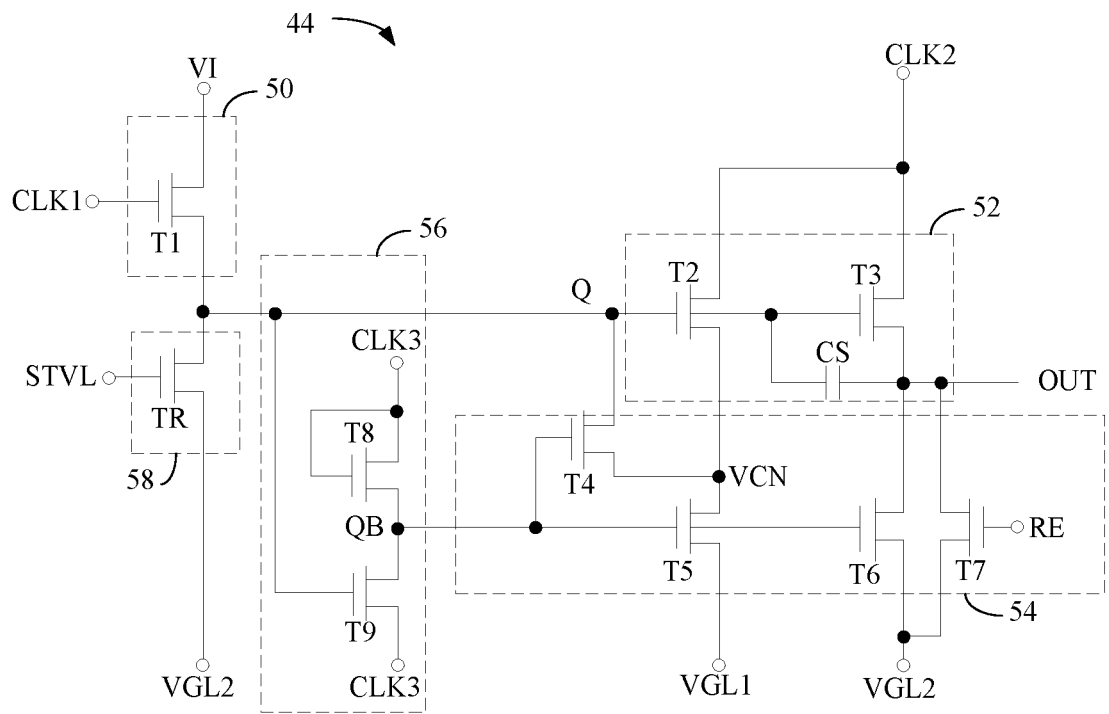
FIG. 12 shows a timing diagram of a gate driving unit according to a fourth embodiment of the present disclosure.
Figure 13:
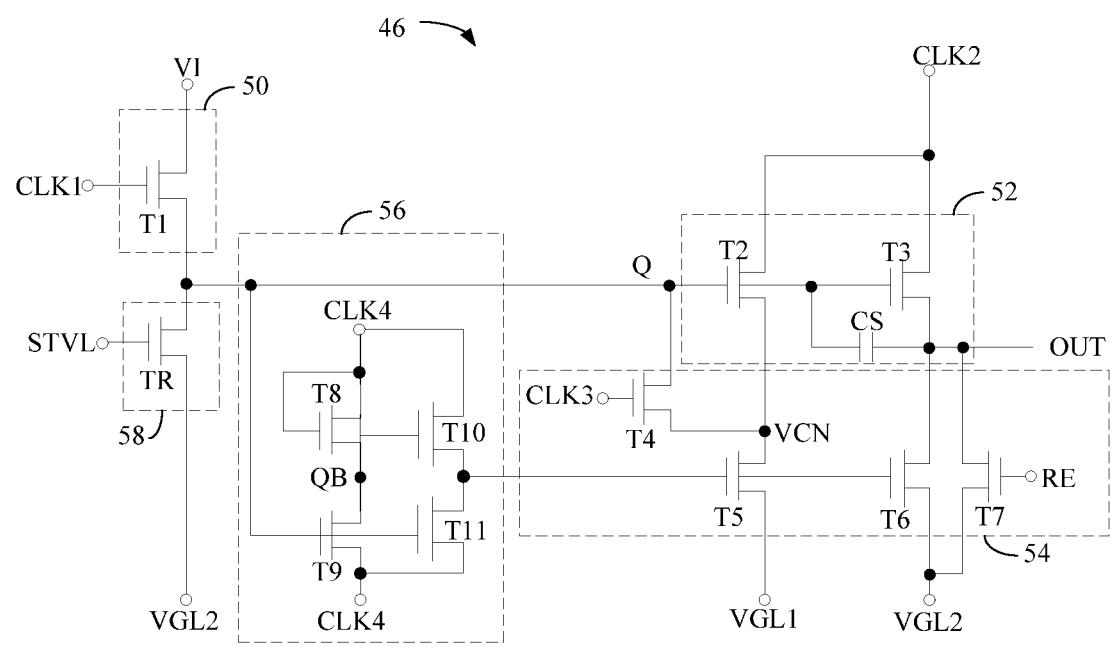
FIG. 13 shows a timing diagram of a gate driving unit according to a fifth embodiment of the present disclosure.

FIG. 12 shows a timing diagram of a gate driving unit according to a fourth embodiment of the present disclosure. The gate driving unit of the fourth embodiment is also used for the gate driving circuit 40 shown in FIG. 4. The gate driving unit 44 of the fourth embodiment has the same units as the input unit 50, the driving unit 52, the pull-down unit 54, the pull-down control unit 56, and the reset unit 58 of the gate driving unit 42 of the first embodiment. Different from the gate driving unit 42 of the first embodiment, in the gate driving unit 44 of the second embodiment, the gate of the fourth transistor T4 of the pull-down unit 54 is connected to the inner node QB (ie, the gate of the fourth transistor T4 is connected to the pull-down control unit 56), the source of the eighth transistor T8 and the ninth transistor T9 in the pull-down control unit 56 receives the third clock signal CLK3. The gate driving unit 44 of the fourth embodiment is suitable for a display panel with a small circuit load, the high electric level signal of the inner node QB is only a few clocks later than the second clock signal CLK2, which can be regarded as almost simultaneous, and thus the additional third clock signal CLK3 is not required. Therefore, there are fewer clock signals required compared to the gate driving unit 42 of the first embodiment. FIG. 13 shows a timing diagram of a gate driving unit according to a fifth embodiment of the present disclosure. The gate driving unit of the fifth embodiment is also used for the gate driving circuit 40 shown in FIG. 4. The gate driving unit 46 of the fifth embodiment has the same units as the input unit 50, the driving unit 52, the pull-down unit 54, the pull-down control unit 56, and the reset unit 58 of the gate driving unit 42 of the first embodiment. Different from the first embodiment, the pull-down control unit 56 further includes a tenth transistor T10 and an eleventh transistor T11, and the sources of the tenth transistor T10 and the eleventh transistor T11 receive the fourth clock signal CLK4, a drain of the tenth transistor of T10 is connected to a drain of the eleventh transistor T11, a gate of the tenth transistor T10 is connected to a node between the drain of the eighth transistor T8 and the drain of the ninth transistor T9, and a gate of the eleventh transistor T11 is connected to node Q. The gate driving unit 46 of the fifth embodiment can further prevent the transistor of the pull-down control unit 56 from causing the electrical leakage due to a negative threshold voltage, turning the fifth transistor T5 and the sixth transistor T6 of the falsely triggered pull-down unit 54 on, so that the electric level of the output terminal of the cascaded signal of the current stage VCN and the output terminal of the current stage OUT is pulled down at a time other than in the electric level maintaining phase, causing the output signal error.

In the gate driving circuit of the embodiment of the present disclosure, the pull-up circuit control module and the pull-down module are connected to the same clock signal terminal, so there is no voltage difference between the pull-up unit and the pull-down unit, and no current is in the path of the pull-up unit and the pull down unit during operation. The electric level of the inner node QB can be fully pulled to the low electric level or the high electric level, thereby increasing the circuit speed and reducing power consumption. When there is a depletion-type transistor in the gate driving circuit, even if the transistor exhibits a negative threshold characteristic, there is no phenomenon of the electrical leakage, therefore reducing the power consumption caused by the electrical leakage, and enhancing the performance of the gate driving circuit in the negative threshold region.

The gate driving circuit of the embodiment of the present disclosure has a simple structure, using the clock signals with different low electric levels and two different low-electric level power sources, and using voltage reverse bias to prevent the electrical leakage. The number of transistors used is less, the structure is simpler, and the occupied area is smaller. According to different usage situations, the M-phase clock signal control (M is an integer greater than or equal to 2) can be adopted, so that the gate driving circuit of the embodiment of the present disclosure has a wider application range. When M is small, it is more advantageous for the realization of a narrow bezel.

The above description is only a preferred embodiment of the present disclosure, and it should be noted that those skilled in the art can also make several improvements and refinements without departing from the principles of the present disclosure. These improvements and refinements should also be considered as in the protected scope of the present disclosure.

What is claimed is:

1. A gate driving unit comprising:
an input unit comprising a first transistor, wherein a source of the first transistor receives an input signal, and a gate of the first transistor receives a first clock signal;
a driving unit comprising a second transistor and a third transistor, wherein a source of the second transistor and a source of the third transistor receive a second clock signal, a gate of the second transistor and a gate of the third transistor are connected to a drain of the first transistor, a drain of the second transistor is connected to an output terminal of a cascaded signal of a current stage, and a drain of the third transistor is connected to an output terminal;
a pull-down unit comprising a fourth transistor, a fifth transistor, a sixth transistor, and a seventh transistor, wherein a gate of the fourth transistor receives a third clock signal, a source of the fourth transistor is connected to the drain of the first transistor, a source of the fifth transistor is connected to a drain of the fourth transistor, a source of the sixth transistor and a source of the seventh transistor are connected to the output terminal, a drain of the fifth transistor is connected to a first reference low electric level, a drain of the sixth transistor and a drain of the seventh transistor are connected to a second reference low electric level, and a gate of the seventh transistor is connected to a cascaded reset signal; and
a pull-down control unit comprising an eighth transistor and a ninth transistor, wherein a gate of the eighth transistor is connected to a source of the eighth transistor, and a gate of the ninth transistor is connected to the drain of the first transistor, a drain of the eighth transistor is connected to a drain of the ninth transistor, and a gate of the fifth transistor is connected to the pull-down control unit.

2. The gate driving unit as claimed in claim 1, wherein the source of the eighth transistor and a source of the ninth transistor receive a fourth clock signal, and the first clock signal, the second clock signal, and the fourth clock signal output a high electric level sequentially.

3. The gate driving unit as claimed in claim 1, wherein the gate driving unit further comprises a reset unit, the reset unit comprises a reset transistor, a source of the reset transistor is connected to the drain of the first transistor, a gate of the reset transistor receives an external control signal, a drain of the reset transistor is connected to the second reference low electric level, and the reset transistor pulls down the drain of the first transistor to the second reference low electric level when the control signal is at a high electric level.

4. A gate driving unit comprising:
an input unit comprising a first transistor, wherein a source of the first transistor receives an input signal, and a gate of the first transistor receives a first clock signal;
a driving unit comprising a second transistor and a third transistor, wherein a source of the second transistor and a source of the third transistor receive a second clock signal, a gate of the second transistor and a gate of the third transistor are connected to a drain of the first transistor, a drain of the second transistor is connected to an output terminal of a cascaded signal of a current stage, and a drain of the third transistor is connected to an output terminal;
a pull-down unit comprising a fourth transistor, a fifth transistor, a sixth transistor, and a seventh transistor, wherein a source of the fourth transistor is connected to the drain of the first transistor, a source of the fifth transistor is connected to a drain of the fourth transistor, a source of the sixth transistor and a source of the seventh transistor are connected to the output terminal, a drain of the fifth transistor is connected to a first reference low electric level, a drain of the sixth transistor and a drain of the seventh transistor are connected to a second reference low electric level, and a gate of the seventh transistor is connected to a cascaded reset signal; and
a pull-down control unit comprising an eighth transistor and a ninth transistor, wherein a gate of the eighth transistor is connected to a source of the eighth transistor, a gate of the ninth transistor is connected to the drain of the first transistor, and a drain of the eighth transistor is connected to a drain of the ninth transistor.

5. The gate driving unit as claimed in claim 4, wherein a gate of the fourth transistor is connected to a third clock signal.

6. The gate driving unit as claimed in claim 4, wherein a gate of the fourth transistor is connected to the pull-down control unit.

7. The gate driving unit as claimed in claim 5, wherein the source of the eighth transistor and a source of the ninth transistor receive a fourth clock signal, and the first clock signal, the second clock signal, and the fourth clock signal output a high electric level sequentially.

8. The gate driving unit as claimed in claim 4, wherein the gate driving unit further comprises a reset unit, the reset unit comprises a reset transistor, a source of the reset transistor is connected to the drain of the first transistor, a gate of the reset transistor receives an external control signal, a drain of the reset transistor is connected to the second reference low electric level, and the reset transistor pulls down the drain of the first transistor to the second reference low electric level when the control signal is at a high electric level.

9. A gate driving method comprising a pre-charge phase, a driving phase, a pull-down phase, and an electric level maintaining phase, wherein the gate driving method further comprises:
- in the pre-charge phase, transmitting an input signal received by a source of a first transistor to a drain of the first transistor when a first clock signal is at a high electric level;
- in the driving phase, when a second clock signal is at the high electric level, receiving the input signal transmitted by the drain of the first transistor by a gate of the second transistor and a gate of the third transistor, a source of the second transistor transmitting the second clock signal to an output terminal of a cascaded signal of a current stage by a source of the second transistor, transmitting the second clock signal to an output terminal by a source of the third transistor, and transmitting the input signal from the drain of the first transistor to the output terminal of the cascaded signal of the current stage by a fourth transistor when the fourth transistor is turned on;
- in the pull-down phase, turning off a fifth transistor and a sixth transistor, and pulling a voltage of the output terminal down to a second reference low electric level by a seventh transistor when a gate of the seventh transistor receives a high electric level signal wherein a source of the fifth transistor is connected to the output terminal of the cascaded signal of the current stage, a source of the sixth transistor is connected to the output terminal, a drain of the fifth transistor is connected to a first reference low electric level, a drain of the sixth transistor is connected to the second reference low electric level, a source of the seventh transistor is connected to the output terminal, and a drain of the seventh transistor is connected to the second reference low electric level; and
- in the electric level maintaining phase, receiving the high electric level transmitted from a drain of a eighth transistor by a gate of the fifth transistor and a gate of the sixth transistor when a gate of the eighth transistor receives the high electric level, pulling an electric level of the output terminal of the cascaded signal of the current stage down to the first reference low electric level by the fifth transistor, and pulling the electric level of the output terminal down to the second reference low electric level by the sixth transistor.

10. The gate driving method as claimed in claim 9, wherein a gate of the fourth transistor is connected to a third clock signal.

11. The gate driving method as claimed in claim 9, wherein a gate of the fourth transistor is connected to the drain of the eighth transistor.

12. The gate driving method as claimed in claim 10, wherein source of the eighth transistor receives a fourth clock signal, and the first clock signal, the second clock signal, and the fourth clock signal output the high electric level sequentially.

13. The gate driving method as claimed in claim 9, wherein a gate of a reset transistor is connected to the drain of the first transistor, a drain of the reset transistor is connected to the second reference low electric level, and an electric level of the drain of the first transistor is pulled down to the second reference low electric level by the reset transistor when the gate of the reset transistor receives the high electric level signal.

* * * * *